(12) United States Patent
Wang

(10) Patent No.: US 6,327,285 B1
(45) Date of Patent: Dec. 4, 2001

(54) SURFACE MOUNTED 2-D DIODE LASER ARRAY PACKAGE

(75) Inventor: Xinqiao Wang, Vestal, NY (US)

(73) Assignee: Semiconductor Laser International Corporation, Binghamton, NY (US)

( * ) Notice: Subject to any disclaimer, the term of this patent is extended or adjusted under 35 U.S.C. 154(b) by 0 days.

(21) Appl. No.: 08/853,956

(22) Filed: May 9, 1997

(51) Int. Cl.[7] ................................. H01S 3/04; H01S 5/00
(52) U.S. Cl. .................................. 372/36; 372/50
(58) Field of Search .................. 372/36, 43, 50, 372/75

(56) References Cited

U.S. PATENT DOCUMENTS

| | | | |
|---|---|---|---|
| 3,883,772 | 5/1975 | Wako et al. | 313/499 |
| 4,267,559 | 5/1981 | Johnson et al. | 257/99 |
| 4,807,238 | 2/1989 | Yokomori | 372/32 |
| 4,894,840 | 1/1990 | Liau et al. | 372/108 |
| 4,920,404 | 4/1990 | Shrimali et al. | 257/98 |
| 5,001,719 | 3/1991 | Trussell | 372/50 |
| 5,012,477 | 4/1991 | Mesquida et al. | 372/50 |
| 5,099,488 | * 3/1992 | Ahrabi et al. | 372/36 |
| 5,187,547 | 2/1993 | Niina et al. | 257/77 |
| 5,212,707 | * 5/1993 | Heidel et al. | 372/43 |
| 5,548,610 | 8/1996 | Bouadma et al. | 372/99 |

FOREIGN PATENT DOCUMENTS

| | | | |
|---|---|---|---|
| 53-126286 | * 4/1978 | (JP) | 372/36 |
| 62-106686 | * 5/1987 | (JP) | 372/50 |

OTHER PUBLICATIONS

Mayer et al, Electronic Materials Science: For Integrated Circuits in Si and GaAs, New York: MacMillan Publishing Company, 1990, pp. 44–46. (No month available).*

IBM Technical Disclosure Bulletin, "Monolithic Laser Arrays with Single–Lobed Farfield", vol. 38, No. 7, pp. 349–350, Jul. 1995.*

* cited by examiner

*Primary Examiner*—Quyen Leung
(74) *Attorney, Agent, or Firm*—Hugh D. Jaeger

(57) ABSTRACT

A two-dimensional surface mounted diode laser array package includes a one-piece multifunctional integral array member having a broad area heat sink, laser mounting stages, and interspersed angled deflecting mirrors, all fashioned of a common material. Diode laser bars are secured to the mounting stages between the angled deflecting mirrors. The broad area heat sink, laser mounting stages, and interspersed angled deflecting mirrors, being of the same substance, can be easily fashioned by conventional micromachining techniques.

5 Claims, 5 Drawing Sheets

SURFACE MOUNTED 2-D DIODE LASER ARRAY PACKAGE

CROSS REFERENCES TO CO-PENDING APPLICATIONS

None.

BACKGROUND OF THE INVENTION

1. Field of the Invention

The present invention pertains to the field of high power semiconductor laser array packages, and more specifically provides a two-dimensional surface mounted diode laser array package configuration for high power laser output, which is efficient in operation.

2. Description of the Prior Art

Prior art diode laser packages required assembly from several parts made from different materials. In the present invention, the whole lower region of the surface mounted array package, upon which package laser diodes are mounted, is made from the same material and can be readily micro-machined, which facilitates; industrial production of the surface mounted 2-D diode laser array packages. The prior art high power diode laser packaging techniques mounted the diode laser bars on thin heat sink sheets and then stacked them together. These bar-stack packages have shortcomings compared to the surface-mount package, such as the difficulties for replacement of the dead or malfunctioning laser bars, difficulty for automatic manufacturing methods, requirement of high-reflectivity coating for the laser diodes, and ineffective heat removal.

The present invention overcomes the problems found in prior art devices and is intended for use in packaging high power semiconductor lasers in order to solve the current problems encountered by most of the current construction techniques. The two-dimensional semiconductor laser array package significantly reduces the distance between the hot spots of the laser diode and the heat sink, so that the heat generated in the laser diodes can be removed more efficiently. Since the mirrors and laser mounting stages can be made from the same material as the broad area heat sink, the whole package can be simply manufactured by conventional automated micro-machining technique. The diode lasers are mounted on the open surface of the package and between the angled mirrors, so they can be accessed easily for automated manufacturing and replacement of damaged lasers.

SUMMARY OF THE INVENTION

The general purpose of the present invention is to provide a surface-mount construction for packaging high power diode laser bars.

According to one embodiment of the present invention, there is provided a surface mounted 2-D diode laser array package comprised of a one-piece integral member including a heat sink and a group of parallel flat mounting stages separated by V-shaped angled mirrors with flat or parabolic reflecting surfaces, and laser diodes suitably attached to the mounting stages. The mounting stages have the same width as the laser diode bars and are slightly higher than the bottoms of the angled mirrors in order to deflect the laser light efficiently. Ceramic standoffs align adjacent to the ends of the laser diodes and the angled mirrors to provide for connection to the laser diodes. High power diode laser bars are surface mounted on the stages to allow for maximum heat removal. Laser light emitted equally from opposing facets of the laser bars is deflected into free space by the angled mirrors and then collected by external optics.

One significant aspect and feature of the present invention is a one-piece multifunctional integral array member including laser bar mounting stages, deflection mirrors, and a broad area heat sink, all integrated and made from the same material, for example OFHC copper (Oxygen Free High Conductivity) or silicon, or other suitable thermally conductive material, significantly reducing the fabrication cost of the packages.

Another significant aspect and feature of the present invention is that the material could be any material that is thermally conductive and, thus, is not limited to OFHC and Si.

Yet another significant aspect and feature of the present invention features diode laser mounting stages which are made from the same material as the heat sink and which are integral with the heat sink, so that the heat generated in the laser can be removed very efficiently by an external heat exchanger.

Still another significant aspect and feature of the present invention is the provision of low profile wire-bonding in order to connect the laser diodes to a laser driver without blocking the laser emission.

An additional significant aspect and feature of the present invention is that any type of high power diode lasers can be mounted as a member of this invented package.

A further significant aspect and feature of the present invention is that the surfaces of the deflection mirrors can be flat, parabolic, or other curved or configured shapes.

Having thus described embodiments of the present invention, it is the principal object of the present invention to provide a surface mounted 2-D diode laser array package which provides for the dispersion of heat from and dispersion of laser energy from diode laser bars.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
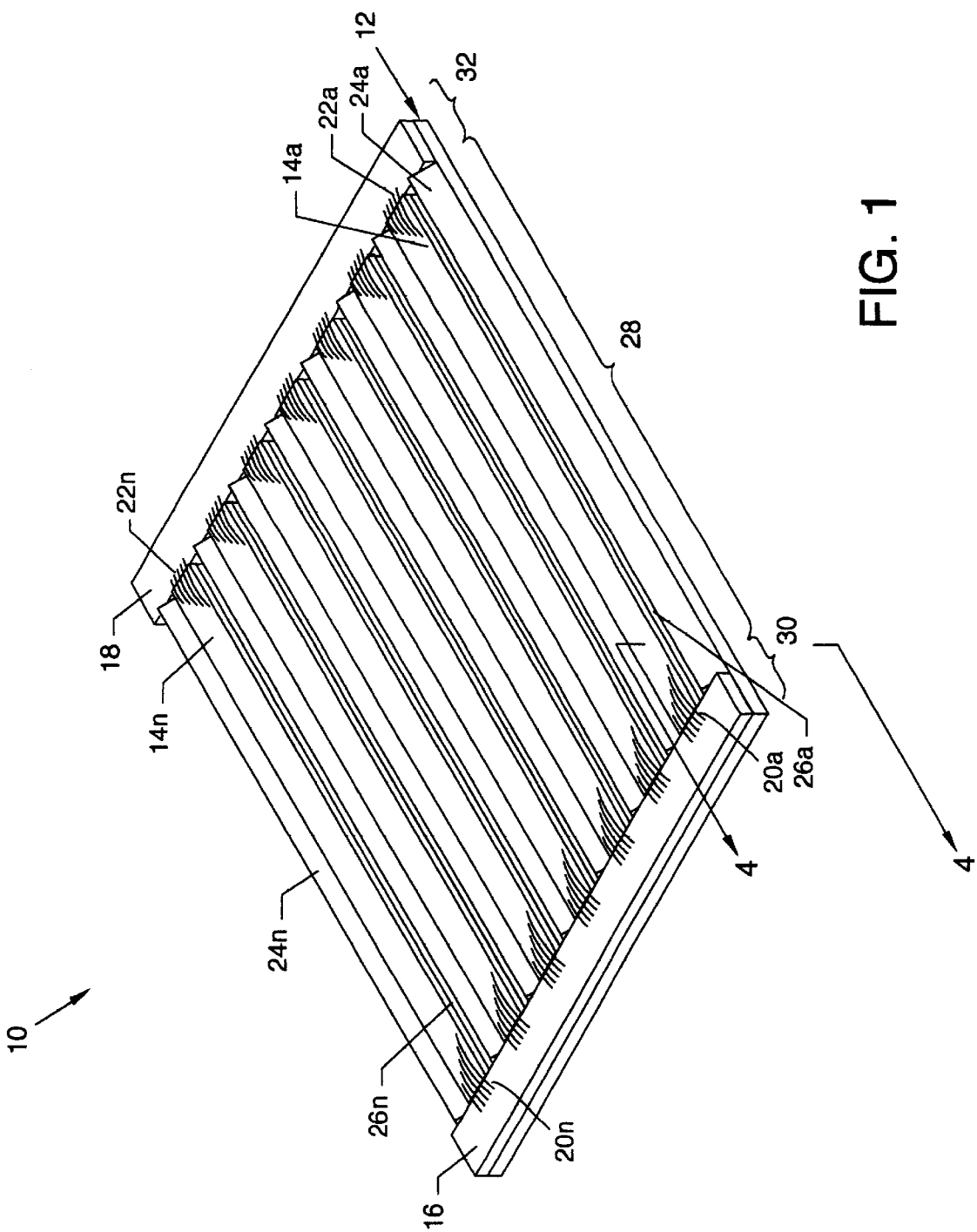
FIG. 1 illustrates an isometric view of a surface mounted 2-D diode laser array package.
Figure 2:
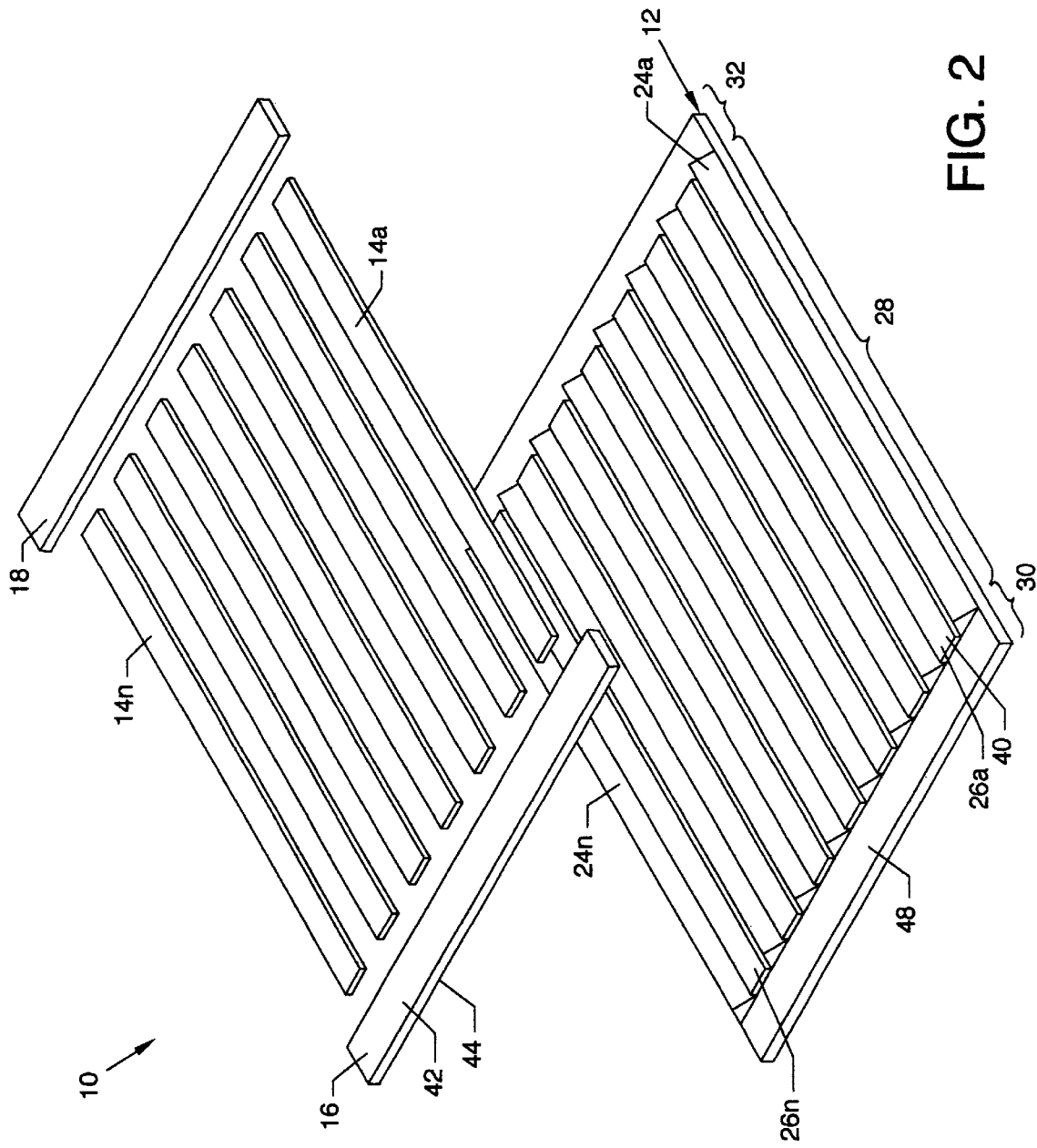
FIG. 2 illustrates an exploded view of the major members of FIG. 1.

FIG. 1 illustrates an isometric view of a surface mounted 2-D diode laser array package 10, the present invention, and FIG. 2 illustrates an exploded view of the major members of FIG. 1. With reference to FIGS. 1 and 2, the surface mounted 2-D diode laser array package 10 is now described. The surface mounted 2-D diode laser array package 10 includes a one-piece multifunctional integral array member 12 of OFHC, silicon or other suitable material that is thermally conductive, a plurality of rectangularly shaped laser diodes 14a–14n in spaced parallel alignment mounted to the one-piece multifunctional integral array member 12, and ceramic standoffs 16 and 18 aligned to the one-piece multifunctional integral array member 12 at right angles to the opposing ends of the laser diodes 14a–14n. A plurality of gold wire groups, including wire groups 20a–20r and 22a–22n, or in the alternative gold ribbon groups, are incorporated for connections between the ceramic standoffs are and 18 and the adjacent ends of the laser diodes 14a–14n, as illustrated. Also illustrated as integral parts of the one-piece multifunctional integral array member 12 are a plurality of integral deflecting mirrors 24a–24n alternately located between a plurality of integral spaced parallel aligned mounting stages 26a–26n. Mounting stages 26a–26n are also integral parts of the one-piece multifunctional integral array member 12. The planar region beneath the alternately spaced integral deflecting mirrors 24a–24n and the mounting stages 26a–26n forms a broad area integral heat sink 28 to draw heat from the mounted laser diodes 14a–14n, deflecting mirrors 24a–24n, and mounting stages 26a–26n. The integral planar regions adjacent to the integral heat sink 28 form mounting pads 30 and 32 for accommodation and mounting of the ceramic standoffs 16 and 18, respectively.

Figure 3:
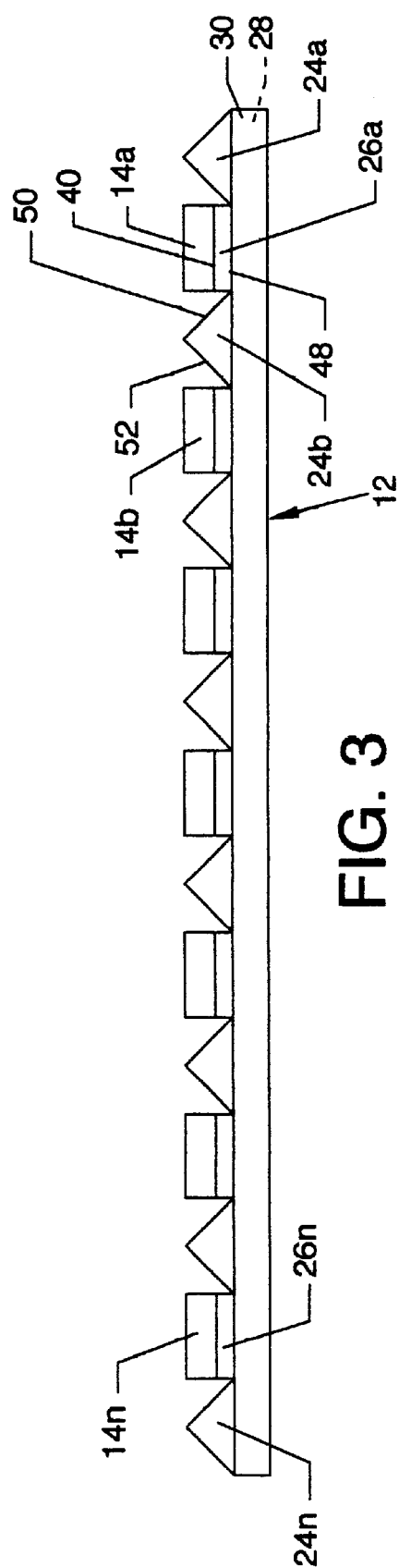
FIG. 3 illustrates a side view of a one piece multifunctional integral array member with laser diodes mounted thereon.

FIG. 3 illustrates a side view of the one-piece multifunctional integral array member 12 with laser diodes 14a–14n mounted thereon, where all numerals correspond to those elements previously described. Illustrated in particular is the alignment of the laser diodes 14a–14n on the mounting stages 26a–26n in alternate spacing with the deflecting mirrors 24a–24n. Deflecting mirrors 24a–24n include polished mirror surfaces 50 and 52. The polished mirror surfaces 50 and 52 are depicted as flat surfaces, but they could be parabolic or other curved shapes.

Figure 4:
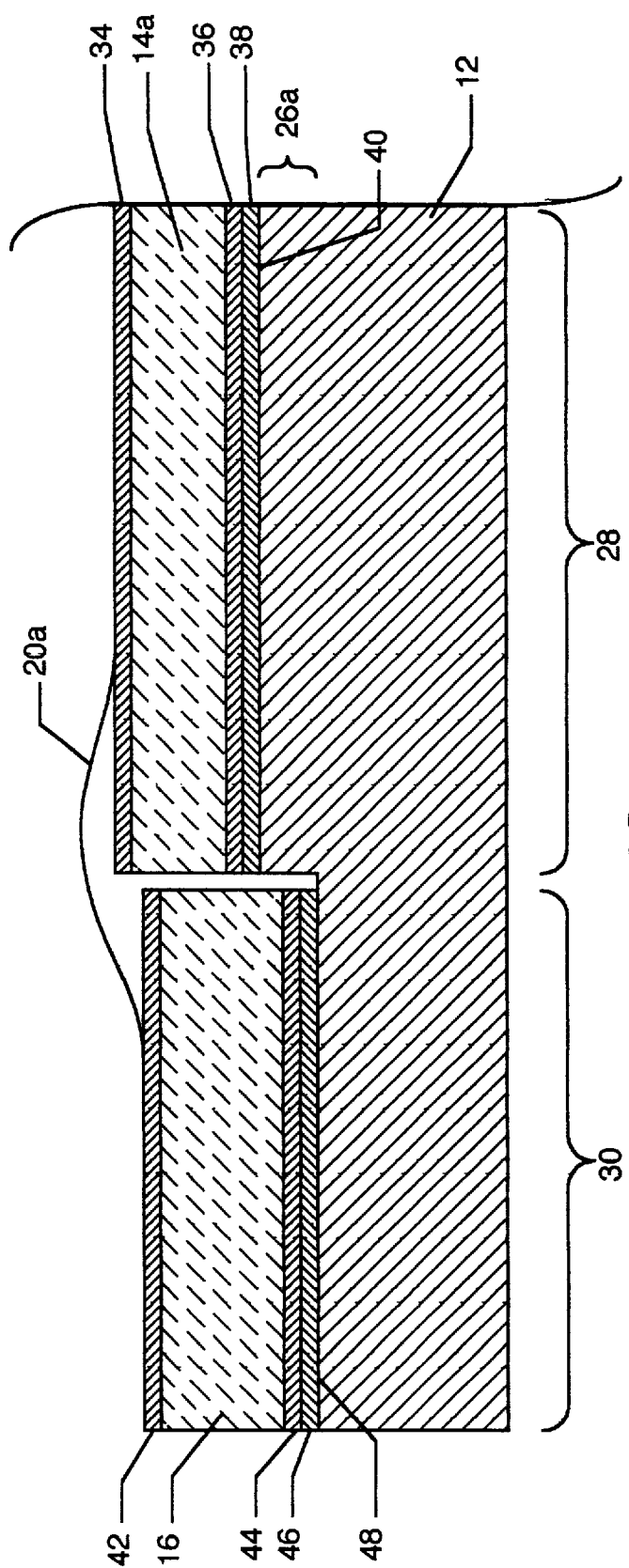
FIG. 4 illustrates a cross sectional view of the surface mounted 2-D diode laser array package along lines 4—4 of FIG. 1; and, FIG. 5 illustrates the shape and relationship of the laser diodes to the one-piece multifunctional integral array member.

FIG. 4 illustrates a cross sectional view of the surface mounted 2-D diode laser array package 10 along line 4—4 of FIG. 1, where all numerals correspond to those elements previously described. Illustrated in particular are the layers of material comprising the heat sink 28, the laser diode 14a, and the ceramic standoff 16. The laser diodes 14a–14n, such as the illustrated diode 14a, include conductive top and bottom layers of gold foil 34 and 36, or other suitable conductive material. A layer of solder 38 or other suitable bonding medium, such as indium, secures and bonds the lower gold film layer 36 of the laser diode 14a to the upper surface 40 of the mounting stage 26a. The ceramic standoff 16 includes conductive top and bottom layers of gold film 42 and 44 or other suitable conductive material. A layer of solder 46 or other suitable bonding medium, such as indium, secures and bonds the lower gold film layer 44 of the ceramic standoff 16 to the upper surface 48 of the mounting pad 30. Wire group 20a is suitably welded between the gold film conductor 34 of the laser diode 14a and the gold film conductor 42 of the ceramic standoff 16 to provide for transfer of electrical energy from the ceramic standoff 16 to the laser diode 14a. The location of the wire groups 20a–20n and 22a–22n in low profile between the ceramic standoffs 16 and 18 and the adjacent ends of the laser diodes 14a–14n, as viewed in previous FIGS. and in FIG. 5, provides for laser transmission which is not interfered with by the wire group members 20a–20n and 22a–22n.

Figure 5:
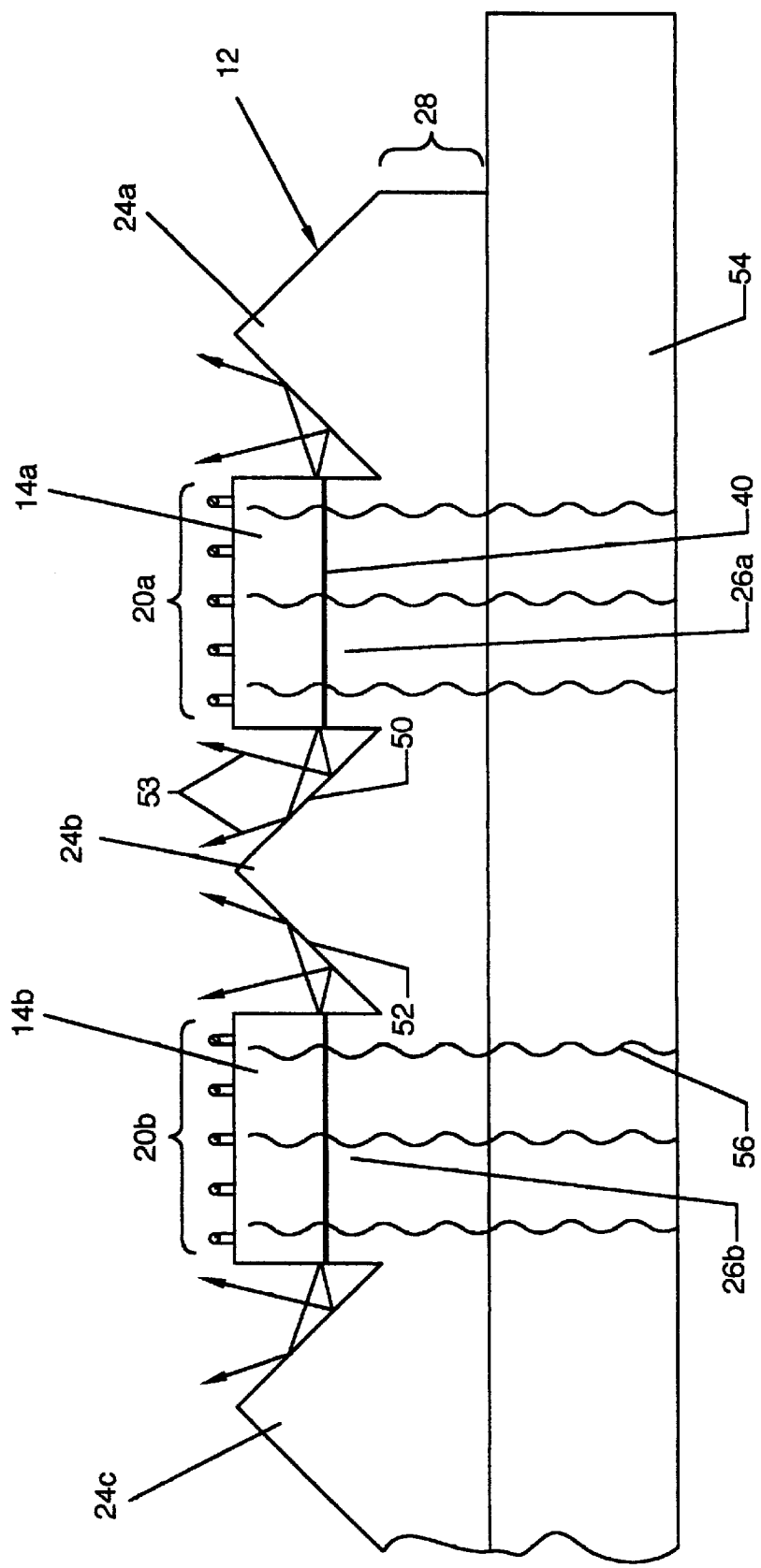

FIG. 5 illustrates the shape and relationship of the laser diodes 14a and 14b to the one-piece multifunctional integral array member 12, where all numerals correspond to those elements previously described. Deflecting mirror 24b, being similar in construction to the accompanying deflecting mirrors 24a and 24c–24n, and located between laser diodes 14a and 14b, includes highly polished mirror surfaces 50 and 52 each opposingly aligned at an angle of 45° Cwith respect to the heat sink 28 and at 900 to each other. Laser beam 53, emitted from the laser diodes 14a and 14b, and shown as arrows, is reflected in a normal direction by the highly polished mirror surfaces 50 and 52. The laser radiation emitted from both ends of the laser diodes 14a and 14b is deflected by the mirrors 24a–24n toward external collecting optics, so as to provide more operating efficiency. The upper surfaces 40 of the mounting stages, such as mounting stages 26a and 26b, are mounted in a position slightly higher than the bottom portions of the adjacent polished mirror surfaces 50 and 52 to prevent blocking the highly divergent light emitted from the laser diodes 14a and 14b and to allow a greater field of polished mirror exposure to be utilized. As previously described, it can be seen that the wire groups, such as wire groups 20a and 20b, are located in a position which does not interfere with the reflected laser energy 53. The surface mounted 2-D diode laser array package 10 can be mounted on a water cooled or an air cooled heat exchanger 54 for effective heat removal. Heat 56 is transferred, as illustrated, from the laser diodes 14a and 14b, and from mounting stages such as mounting stages 26a and 26b, through the broad base heat sink 28 and to the heat exchanger 54 to effect cooling of the surface mounted 2-D diode laser array package 10. Preferably the thickness of the broad base heat sink 28 is as thin as to facilitate heat dissipation from the laser diodes 4a–14n and other members.

Various modifications can be made to the present invention without departing from the apparent scope hereof.

SURFACE MOUNTED 2-D DIODE LASER ARRAY PACKAGE

Parts List 10 surface mounted 2-Diode laser array package
12 one-piece multifunctional integral array member
14a–n laser diodes
16 ceramic standoff
18 ceramic standoff
20a–n wire groups
22a–n wire groups
24a–n deflecting mirrors
26a–n mounting stages
28 heat sink
30 mounting pad
32 mounting pad
34 gold film layer or conductor
36 gold film layer or conductor
38 solder
40 upper surface
42 gold film layer or conductor
44 gold film layer of conductor
46 solder
48 upper surface
50 mirror surface
52 mirror surface
53 laser beam
54 heat exchanger
56 heat

I claim:
1. A surface mounted diode laser array package comprising, in order:

a. a heat exchanger;

b. a heat sink in intimate heat transferring relationship with said heat exchanger and having a plurality of mirror surfaces and upper surfaces; said upper surfaces being of an elongate planar shape and positioned between said mirror surfaces; said mirror surfaces positioned at 45 degrees with respect to said planar surfaces;

c. laser diodes affixed to said upper surfaces and emitting radiation in a direction generally parallel to said upper surfaces to impinge on said mirrors, which reflect said radiation to provide a combined output beam in a direction perpendicular to said upper surfaces; and, d. including ceramic standoffs adjacent said laser diodes.

2. The package of claim 1, including wire groups connecting said ceramic standoffs to said laser diodes.

3. A diode laser array package having a plurality of surface mounted diode lasers arranged to provide a single output beam comprising:

a. heat exchanger means having at least one planar surface;

b. a plurality of elongate heat sink means of a first, high heat conductivity material, having planar upper and lower surfaces, said diode laser means affixed to said upper surfaces in intimate heat transferring contact therewith, said lower surface affixed to, and in intimate heat transferring contact with, said heat exchanger means planar surface;

c. a plurality of elongate mirror means, of the first, high heat conductivity material, positioned between said heat sink means and in intimate heat transferring contact therewith, having a planar lower surface affixed to, and in intimate heat transferring contact with, said heat exchanger means planar surface, and a pair of reflective mirror, upper surfaces disposed at right angles to each other, each of which is positioned at 45 degrees with respect to the adjacent of said heat sink upper planar surfaces, whereby the radiation beams emitted by said diode lasers parallel to said upper planar surface are reflected to provide a single output beam in a direction perpendicular to said upper planar surfaces.

4. A diode laser array package according to claim 3, wherein said reflective mirror upper surfaces of said elongate mirror means extend from a position below said planar upper surfaces of said elongate heat sink means.

5. A diode laser array package according to claim 4, wherein said heat sink means and said mirror means are discrete, individual, elements.

* * * * *